(12) United States Patent
Kar et al.

(10) Patent No.: US 8,142,890 B1
(45) Date of Patent: Mar. 27, 2012

(54) FABRICATION OF HIGH ASPECT RATIO CORE-SHELL CDS-MN/ZNS NANOWIRES

(75) Inventors: Soumitra Kar, Orlando, FL (US); Swadeshmukul Santra, Orlando, FL (US)

(73) Assignee: University of Central Florida Research Foundation, Inc., Orlando, FL (US)

( * ) Notice: Subject to any disclaimer, the term of this patent is extended or adjusted under 35 U.S.C. 154(b) by 654 days.

(21) Appl. No.: 12/328,233

(22) Filed: Dec. 4, 2008

Related U.S. Application Data

(60) Provisional application No. 60/992,532, filed on Dec. 5, 2007.

(51) Int. Cl.
*B32B 5/16* (2006.01)
(52) U.S. Cl. ........ 428/375; 428/379; 428/403; 977/762; 977/813; 977/824
(58) Field of Classification Search .......... 428/403–406, 428/375, 379; 977/762, 813, 824
See application file for complete search history.

(56) References Cited

U.S. PATENT DOCUMENTS

| | | | | |
|---|---|---|---|---|
| 6,048,616 | A * | 4/2000 | Gallagher et al. | 428/407 |
| 6,207,229 | B1 * | 3/2001 | Bawendi et al. | 427/215 |
| 6,322,901 | B1 * | 11/2001 | Bawendi et al. | 428/548 |
| 6,780,242 | B2 * | 8/2004 | Norris | 117/104 |
| 2002/0130311 | A1 * | 9/2002 | Lieber et al. | 257/1 |
| 2003/0089899 | A1 * | 5/2003 | Lieber et al. | 257/9 |
| 2005/0214967 | A1 * | 9/2005 | Scher et al. | 438/63 |
| 2006/0009003 | A1 * | 1/2006 | Romano et al. | 438/382 |
| 2007/0070341 | A1 * | 3/2007 | Wang | 356/301 |

OTHER PUBLICATIONS

Radovanovic et al., General synthesis of Manganese-doped II-VI and III-V semiconductor nanowires, Nano Lett. vol. 5, No. 7, 1407-1411 (2005).*
Hsu & Lu, One-step preparation of coazial CdS-ZnS nanowires, Chem. Comm. , 2102-2103 (2004).*
Qian et al., Core-Multishell Nanowire Heterostructures as multicolor, high-efficiency light-emitting diodes, Nano Lett., vol. 5, No. 11, 2287-2291 (2005).*
Iijima, Sumio, Helical Microtubules of Graphitic Carbon, Letters to Nature, 1991, pp. 56-58, vol. 354.
Lauhon, Lincoln J. et al., Epitaxial Core-Shell and Core-Multishell Nanowire Heterostructures, Letters to Nature, 2002, pp. 57-61, vo. 420.

(Continued)

*Primary Examiner* — Hoa (Holly) Le
(74) *Attorney, Agent, or Firm* — Brian S. Steinberger; Joyce Morlin; Law Offices of Brian S. Steinberger, P.A.

(57) ABSTRACT

Compositions and methods for fabrication or synthesis of high aspect ratio (up to >150) CdS:Mn/ZnS core/shell nanowires (CSNWs) is disclosed for the first time. The CSNW solvothermal synthesis involved two steps—the formation of Mn doped CdS core followed by the growth of a ZnS outer shell. The nanowire growth process is engineered in such a way that the ZnS layer grows radially onto the prematurely grown CdS:Mn core prior to the formation of its well faceted surface. Transmission electron microscopy (TEM) and other characterization techniques confirmed the formation of uniform, thin (5-8 nm in diameter) CSNWs with high aspect ratio up to >150. This solvothermal method is simple, versatile and useful in a large scale production process to synthesize thin ultra-long CSNWs with and without dopants.

14 Claims, 6 Drawing Sheets

OTHER PUBLICATIONS

Chueh, Yu-Lun et al., RuO2 Nanowires and RuO2/TiO2 Core/Shell Nanowires: From Synthesis to Mechanical, Optical, Electrical, and Photoconductive Properties, Advanced Materials, 2007, pp. 143-149, vol. 19.

Talapin, Dmitri V. et al., High Emissive Colloidal CdSe/CdS Heterostructures of Mixed Dimensionality, Nanoletters, 2003, pp. 1677-1681, vol. 2, No. 12.

Mokari, Taleb et al., Synthesis and Properties of CdSe/ZnS Core/Shell Nanorods, Chemistry of Materials, 2003, pp. 3955-3960, vol. 15, No. 20.

Hsu, Yung-Jung et al., One-Step Preparation of Coaxial CdS-ZnS Nanowires, ChemComm, 2004, pp. 2102-2103.

Lee, Hyeokjin et al., Synthesis and Characterization of Colloidal Ternary ZnCdSe Semiconductor Nanorods, Journal of Chemical Physicas, 2006, pp. 164711-1-164711-2, vol. 125.

Manna, Liberato et al., Epitaxial Growth and Photochemical Annealing of Graded CdS/ZnS Shells on Colloidal CdSe Nanorods, Journal of the American Chemical Society, 2002, pp. 7136-7145, vol. 124, No. 24.

Hong, X. et al., Optical Properties of Manganese-Doped Nanocrystals of ZnS, Physical Review Letters, 1994, pp. 416-419, vol. 72, No. 3.

Biswas, Subhajit et al., Optical and Magnetic Properties of Manganese-Incorporated Zinc Sulfide Nanorods Synthesized by a Solvothermal Process, The Journal of Physical Chemistry, 2005, pp. 17526-17530, vol. 109, No. 37.

Choi, Heon-Jin et al., Single-Crystalline Diluted Magnetic Semiconductor GaN:Mn Nanowires, Advanced Materials, 2005, pp. 1351-1356, vol. 17.

Han, Doo Suk, et al., Ferromagnetic Mn-doped GaN Nanowires, Applied Physics Letters, 2005, pp. 032506-1-032506-3, vol. 86.

Yang, Heesun, et al., Efficient and Photostable ZnS-Passivated CdS:Mn Luminescent Nanocrystals, Advanced Functional Materials, 2004, pp. 152-156, vol. 14, No. 2.

Santra, Swadeshmukul et al., Synthesis of Water-Dispersible Fluorescent, Radio-Opaque, and Paramagnetic CdS:Mn/ZnS Quantum Dots: A Multifunctional Probe for Bioimaging, Journal of the American Chemical Society, 2007, pp. 1656-1657, vol. 127, No. 6.

Yang, Heesun et al., GdIII Functionalized Fluorescent Quantum Dots as Multimodal Imaging Probes, Advanced Materials, pp. 2890-2894, vol. 18, (2006).

Yu, Shu-Hong et al., Controllable Synthesis of Nanocrystalline CdS with Different Morphologies and Particle Sizes by a Novel Solvothermal Process, Journal of Materials Chemistry, 1999, pp. 1283-1287, vol. 9.

Kar, Soumitra et al., Morphology and Size Dependent Optical Properties of CdS Nanostructures, Journal of Nanoscience and Nanotechnology, 2006, pp. 771-776, vol. 6.

Datta, Anuja et al., Solvothermal Synthesis of CdS Nanorods: Role of Basic Experimental Parameters, Journal of Nanoscience and Nanotechnology, 2007, pp. 677-688, vol. 7.

Deng, Zhao-Xiang et al., Novel Inorganic-Organic-Layered Structures: Crystallographic Understanding of Both Phase and Morphology Formations of One-Dimensional CdE (E=S, Se, Te) Nanorods in Ethylenediamine, Inorganic Chemistry, 2003, pp. 2331-2341, vol. 42, No. 7.

Kar, Soumitra et al., Fabrication of High Aspect Ratio Core-Shell CdS-Mn/ZnS Nanowires by a Two Step Solvothermal Process, The Journal of Physical Chemistry Letters, 2008, pp. 4036-4041, vol. 112.

* cited by examiner

FABRICATION OF HIGH ASPECT RATIO CORE-SHELL CDS-MN/ZNS NANOWIRES

This invention claims priority based on U.S. Provisional Application Ser. No. 60/992,532 filed on Dec. 5, 2007, the contents of which are incorporated herein by reference.

FIELD OF THE INVENTION

This invention relates to core-shell nanowires, and in particular to, compositions and methods of fabricating or synthesizing novel one dimensional (1-D) CdS:Mn/ZnS core/shell semiconductor nanowires. The research herein was supported in part by the National Science Foundation (NSF CBET-63016011 and NSF-NIRT Grant EEC-056560.

BACKGROUND AND PRIOR ART

One dimensional (1D) nanostructures have received tremendous attention in the field of electronics and optoelectronics since the discovery of carbon nanotubes, as reported by S. Iijima, Nature 1991, 354, 56. In particular, 1D semiconductor nanostructures are considered to be critical building blocks for nanoscale electronic and optoelectronic devices. To improve performance of these nanodevices, it is important that the efficiency of 1D semiconductor nanostructures be increased. Since surface defects are prominent due to large surface to volume ratio, efficiency of nanostructures and hence their performance in nanodevices could be improved by reducing surface defects.

Thus the focus now is on developing synthesis strategies for effective surface passivation of 1D nanostructure that minimizes surface defects. To date, the best surface passivation approach is the creation of radial hetero-structures such as core/shell nanostructures. In a typical surface passivation procedure, a shell structure of a wide band-gap material is created over the core. In an effectively surface passivated core/shell nanostructure, the core is completely covered by an epitaxial shell with minimal lattice mismatch between the core and the shell. Due to limited availability of appropriate shell layer material, to date, only a few 1D core/shell nanostructures have been reported in the literature including Ge/Si, as reported by L. J. Lauhon, et al. in *Nature* 2002, 420, 57; $RuO_2/TiO_2$ as disclosed by Y. L. Chueh, et al. in *Advanced Materials* 2007, 19, 143; CdSe/CdS as reported by D. V. Talapin, et al., in *Nano Letters* 2003, 3, 1677; CdSe/ZnS as reported by T. Mokari et al. in *Chemistry of Materials* 2003, 15, 3955; CdS/ZnS as disclosed by Y. J. Hsu, et al. in *Chemical Communications* 2004, 2102; and CdSe/ZnSe as disclosed by H. Lee et al. in *Journal of Chemical Physics* 2006, 125.

Traditionally, 1D core/shell nanostructures have been synthesized using high-temperature vapor deposition methods such as chemical vapor deposition (CVD) and metallo-organic chemical vapor deposition (MOCVD). These methods are sophisticated and demand controlled step-wise supply of core and shell elements in the vapor state. It is therefore desirable to develop a relatively simple method of synthesizing 1D core/shell nanostructures. Moreover it is desired that methods are developed to synthesize core/shell nanostructures with high aspect ratio, such as CSNWs. In this context, hot-phase chemical routes appear to be more attractive than traditional CVD methods. However, synthesis of 1D nanostructure with a large aspect ratio (i.e. length to diameter) using hot phase chemical route is challenging. So far, only short nanorods have been reported in the literature, for example, L. Manna, et al. in *Journal of the American Chemical Society* 2002, 124, 7136; however, there are inherent limitations of the method. Synthesis of dopant based thin (<10 nm) 1D core/shell nanostructures with high aspect ratio such as core shell nanowires (CSNWs) has not been reported using the aforementioned methods.

The cadmium sulfide (CdS) based nanostructures are among the most widely studied semiconductor nanomaterials due to their widespread applications in the field of electronics and optoelectronics. Both cadmium sulfide (CdS) and zinc sulfide (ZnS) are II-VI group semiconductors and they have similar crystalline structure. However, ZnS has higher band gap energy than CdS (~3.7 eV versus 2.4 eV when measured in the bulk). Owing to relatively higher band gap energy, ZnS has been widely used as surface passivating shell material for CdS. The divalent $Mn^{2+}$ ions are appropriate as dopants for both of these II-VI group semiconductor materials. Upon excitation, the $Mn^{2+}$ doped semiconductors produce characteristic bright yellow luminescence (~585 nm emission) due to the $^4T_1 \Rightarrow ^6A_1$ $Mn^{2+}$ ion transition as reported by R. N. Bhargava et al. in *Physical Review Letters* 1994, 72,416 and S. Biswas et al. in *Journal of Physical Chemistry B* 2005, 109, 17526. Also, as building blocks in nanoscale optoelectronic devices as discussed by H. J. Choi, et al. in *Advanced Materials* 2005, 17, 1351 and D. S. Han et al. in *Applied Physics Letters* 2005, 86, these $Mn^{2+}$ ions doped CdS semiconductors are utilized as dilute magnetic semiconductors.

To date, a few reports on the CdS:Mn/ZnS core/shell nanoparticles have been published but none of the published references discuss the synthesis of CdS:Mn/ZnS CSNWs. The publications that discuss CdS:Mn/ZnS are by H. Yang et al in *Advanced Functional Materials* 2004, 14, 152; S. Santa, et al. in *Journal of the American Chemical Society* 2005, 127, 1656; and H. S. Yang, et al. in *Advanced Materials* 2006, 18, 2890.

An easy, simple, inexpensive synthesis method for core shell nanowires is needed and would significantly benefit the semiconductor industry. The synthesis method and novel one dimensional (1D) core shell semiconductor nanowires of the present invention solve many problems and overcome many limitations in the prior art.

SUMMARY OF THE INVENTION

The first objective of the present invention is to provide a simple two-step solvothermal route for the fabrication or synthesis of thin single-crystal CdS:Mn/ZnS CSNWs with length to diameter ratio (aspect ratio) up to approximately 150.

The second objective of the present invention is to provide a novel composition for a one dimensional (1-D) CdS:Mn/ZnS core/shell structure.

The third objective of the present invention is to provide a fabrication or synthesis protocol for the large scale production of high quality, single crystalline, uniform structure core shell nanowires (CSNWs).

The fourth objective of the present invention is to provide a fabrication or synthesis protocol for dopant based CdS:Mn/ZnS core/shell nanowire as spintronics material.

The fifth objective of the present invention is to provide a simple, cost-effective fabrication or synthesis method for CSNWs with high reproducibility.

The sixth objective of the present invention is to provide a fabrication or synthesis protocol for CSNWs with relatively low synthesis temperatures of approximately 160 degrees C.

The seventh objective of the invention is to provide a fabrication or synthesis protocol for ultra-thin core shell nanowires (CSNWs) less than approximately 10 nanometers (nm) in diameter.

The eighth objective of the invention is to provide novel core/shell nanowires useful in a broad array of applications, including, but not limited to, materials for high-performance wave guide application, solar cell absorber material, room temperature yellow light emitting material, single nanowire based laser, thin-film nanowire transistor, light emitting displays (LED), non-linear optical materials and photonic circuit elements.

A preferred method for fabricating or synthesizing a dopant based core/shell single-crystalline, one dimensional CdS:Mn/ZnS nanowire includes selecting a reaction chamber, mixing cadmium acetate and thiourea in a 1:3 molar ratio with ethylenediamine solvent to form mixture I, adding the mixture of cadmium acetate, thiourea and ethylenediamine (mixture I) to the reaction chamber, adding a dopant source to the reaction chamber, closing the reaction chamber for a first time and placing the chamber in a preheated oven, allowing the reaction of cadmium acetate, thiourea, ethylenediamine (mixture I) and dopant to continue for approximately six hours to facilitate the solvothermal growth of cadmium sulfide nanorods and nanowires, removing the reaction chamber from the preheated oven after six hours and adding a mixed aqueous solution (mixture II) consisting of zinc acetate dehydrate, thiourea and water, closing the reaction chamber a second time and placing the chamber in a preheated oven, allowing the reaction of mixture I, dopant and mixture II to continue for approximately an additional 4 hours to facilitate the growth of a doped cadmium sulfide core with a zinc sulfide outer shell, removing the reaction chamber from the preheated oven for a second time and allowing the reactor to cool, and collecting a yellow precipitate that is washed, dried and analyzed to be a doped cadmium sulfide/zinc sulfide (CdS:Mn/ZnS) core/shell nanowire.

The more preferred method of fabricating or synthesizing a dopant based core/shell single-crystalline, one dimensional CdS:Mn/ZnS nanowire includes a reaction chamber that is a closable cylindrical stainless steel chamber lined with a polymeric non-stick coating.

The preferred dopant source is manganese (Mn) and the preferred mixed aqueous solution (mixture II) consists of water, zinc acetate dihydrate in an amount that is 2.6 molar times that of the Cd molar concentration in mixture I and thiourea in an amount that is 3 molar times that of the Zn molar concentration in mixture II.

The preheated oven in the preferred fabricating or synthesizing process is maintained at a temperature that is between approximately 155° C. and approximately 165° C., more preferably a temperature that is approximately 160° C.

A preferred composition for a thin, dopant based core/shell single-crystalline, one dimensional nanowire includes a doped cadmium sulfide core, a zinc sulfide outer shell layered onto the doped cadmium sulfide core, an overall diameter of the nanowire that is less than approximately 10 nanometers (nm), and an overall length to diameter ratio up to approximately 150.

The more preferred thin, dopant based core/shell single-crystalline, one dimensional nanowire has a diameter in a range between approximately 5-8 nm and a length in a range between approximately 100 to 1000 nm.

The preferred dopant for the cadmium sulfide core in a one dimensional nanowire is manganese (Mn) and the preferred composition is manganese doped cadmium sulfide core with zinc sulfide shell (CdS:Mn/ZnS) wherein the zinc sulfide shell is formed radially surrounding the doped cadmium sulfide core.

The preferred one dimensional nanowire has a room temperature photoluminescence spectra of the core/shell that exhibits a strong yellow emission band at approximately 585 nanometer (nm) wavelength along with a weak green emission peak at approximately 514 nm wavelength.

Further objects and advantages of this invention will be apparent from the following detailed description of a presently preferred embodiment that is illustrated schematically in the accompanying drawings.

DESCRIPTION OF THE PREFERRED EMBODIMENT

Figure 1:
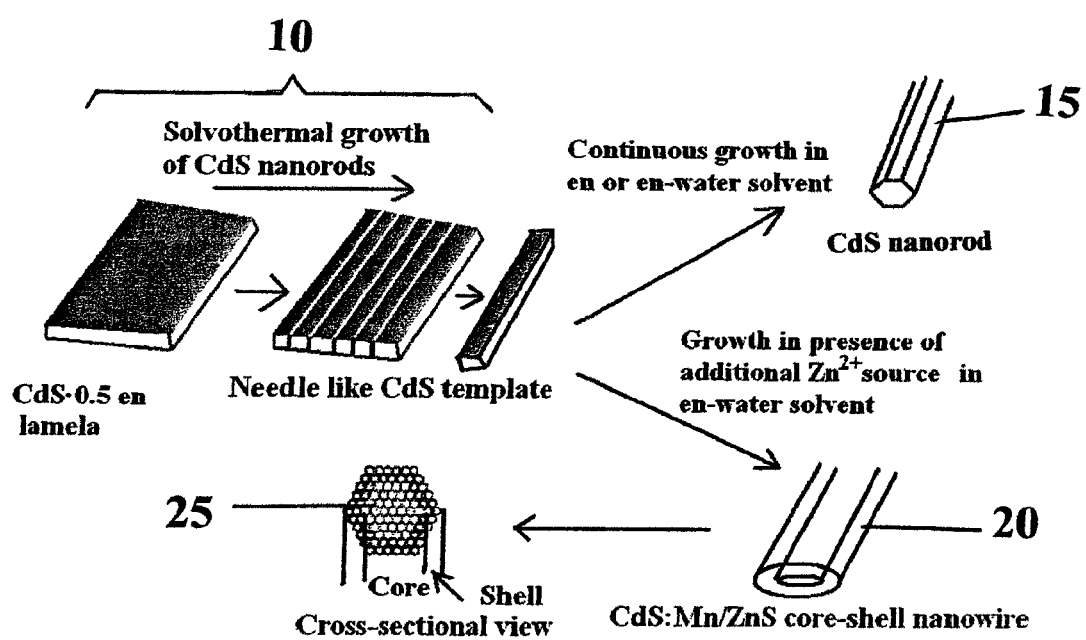
FIG. 1 is a schematic representation of the CdS:Mn/ZnS core sell nanowire (CSNW) formation mechanism.

Before explaining the disclosed embodiment of the present invention in detail it is to be understood that the invention is not limited in its application to the details of the particular arrangement shown since the invention is capable of other embodiments. Also, the terminology used herein is for the purpose of description and not of limitation.

It would be useful to discuss the meanings of some words and abbreviations used herein to explain the invention in greater detail.

CdS is the chemical formula for cadmium sulfide

CSNW stands for core/shell nanowire.

core/shell is used herein to describe the concentric arrangement of a doped metallic sulfide core surrounded by an outer layer or shell consisting of a metallic sulfide.

en is the abbreviation for ethylenediamine, a chemical compound used as a bidentate ligand Mn is the chemical symbol for manganese "Nanowires" are defined as structures that have a lateral size constrained less than 1000 nanometers and an unconstrained longitudinal size. Typical nanowires exhibit aspect ratios (length-to-width ratio) of 4 or more; as such, they are often referred to as one (1)-dimensional materials. Nanowires are not observed spontaneously in nature and must be produced in a laboratory.

ZnS is the chemical formula for zinc sulfide.

Incorporated herein by reference is a published manuscript by S. Kar et al., entitled, "Fabrication of High Aspect Ratio Core-Shell CdS-Mn/ZnS Nanowires by a Two Step Solvothermal Process," *J. Phys. Chem. C.* 2008, 112, 4036-4041, published after the filing of the related priority U.S. provisional application Ser. No. 60/992,532 on Dec. 5, 2007.

The present invention is a method for the large scale synthesis and production of thin single-crystal core shell nanowires of high quality and high aspect ratios. The specific nanowire composition disclosed herein is CdS:Mn/ZnS; however, it is understood that other dopants and metallic sulfides are suitable for use in synthesis and production of useful nanowires. Suitable metallic sulfides and dopants include the class of transition metals that are hard, brittle, with high melting points and high electrical conductivity. Exemplary transition metals, include, but are not limited to, titanium, vanadium, chromium, manganese, iron, cobalt, nickel, copper, zinc, yttrium, zirconium, niobium, molybdenum, ruthenium, rhodium, palladium, silver, cadmium, hafnium, tantalum, and tungsten.

Controlled growth of CSNWs is challenging as it demands favorable thermodynamic as well as kinetic conditions that would allow crystalline growth in one dimension (1D). An attempt to incorporate dopants within the core of such CSNWs could be further challenging as the crystal growth process described by S. H. Yu in *Journal of Materials Chemistry* 1999, 9, 1283, the process naturally excludes impurities such as, dopants. It would be desirable to create appropriate reaction conditions that allow doping of manganese (Mn) within CSNWs. In the past, solvothermal route has been successfully used to synthesize CdS nanorods with the help of a bidentate ligand, ethylenediamine ($NH_2CH_2CH_2NH_2$, en); reported by S. Kar et al. in *Journal of Nanoscience and Nanotechnology* 2006, 6, 771; A. Datta et al. *Journal of Nanoscience and Nanotechnology* 2007, 7, 677; and Z. X. Deng et al. in *Inorganic Chemistry* 2003, 42, 2331.

The solvothermal route for the en mediated 1D nanostructure template synthesis of CdS is used in the present invention. Subsequently, a controlled crystal growth process is initiated in the presence of shell layer source ions to obtain uniform CSNWs. The complete CSNW design scheme is depicted in FIG. 1.

FIG. 1 shows solvothermal growth of CdS nanorods 10 in a sequence that begins with a thin sheet of CdS in a solvent to produce a needle-like CdS template and continuing growth in a solvent to form a CdS nanorod 15 and subsequent growth of a ZnS shell layer onto the CdS:Mn core to produce a CdS:Mn/ZnS core shell nanowire 20 having a cross-sectional view 25 of a faceted core/shell nanowire. The growth of the ZnS shell layer onto the CdS:Mn core starts prior to the formation of a well faceted core. After approximately 6 hours of reaction to form a CdS:Mn core, Zn ions, S ions and water are added to the reaction that formed the CdS:Mn core, then during approximately 4 additional hours of reaction time a ZnS crystal layer forms over high energy surface of a CdS:Mn core resulting in the uniform growth of long, narrow (<10 nm diameter) nanowires.

In the traditional synthesis approach reported by S. Kar (2006) supra and A. Datta (2007) supra, cadmium acetate and thiourea (1:3 molar ratio) are mixed in ethylenediamine (en) that also serves as a solvent. The manganese dopant content is kept at three molar percent of the Cd source to avoid concentration-quenching. The $Cd^{2+}$ metal ions interact with the lone pair of electrons of the en nitrogen atoms. A subsequent reaction of en ligated $Cd^{2+}$ ions with the $S^{2-}$ ions forms a 2D complex of CdS0.5en, as reported by Z. X. Deng et al, in *Inorganic Chemistry* 2003, 42, supra. This complex possesses an organic-inorganic lamellar structure with inorganic CdS layers separated by organic en spacers.

Referring to FIG. 1, as the solvothermal growth reaction 10 proceeds, the transition metal sulfide complex dissociates, collapsing the lamellar structure. As a result, needle-shaped CdS templates are formed. Under normal solvothermal conditions, the CdS.0.5en and CdS phase remain in equilibrium that favors en assisted recrystallization of the CdS templates. Over time, the CdS templates lead to the formation of well faceted CdS nanorods 15. The mechanism of CdS nanorod formation could be due to en assisted recrystallization of the CdS templates and/or Ostwald ripening.

The elimination of the en from the CdS.0.5en complex could be enhanced by increasing the thermal energy or by introducing a foreign non-coordinating solvent such as water. It has been demonstrated by A. Datta, et al. (2007) supra that increase of temperature leads to shortening of nanorod length and increase of their diameter. It is a hypothesis that addition of water at relatively low temperature (160° C.) could lead to the formation of well crystallized thin (<10 nm) nanowires. However, it is important to add water at a stage that would favor formation of uniform nanowires.

In order to create thin nanowires 20, two important reaction parameters—temperature and solvent composition (water addition) are manipulated. Allowing the reaction to continue at 160° C. was appropriate to minimize Ostwald ripening related lateral growth of the 1D nanostructure. Again, addition of water after 6 hrs of reaction in en not only facilitated the decomposition of the CdS.0.5en complex, forming CdS needle shaped templates but also restricted lateral growth by reducing en assisted recrystallization of the CdS templates.

To synthesize thin (<10 nm) CSNWs with high aspect ratio, the growth of the ZnS shell layer onto the CdS:Mn core must start prior to the formation of a well faceted core 25. Therefore, zinc ($Zn^{2+}$) ion and sulfur ($S^{2-}$) ion sources are introduced in water at the intermediate stage (after 6 hrs) of the reaction. This favored the formation of a zinc sulfide (ZnS) crystal layer over the high-energy surface of the CdS:Mn templates. The ZnS shell layer formation predominated over two other competing processes, such as, recrystallization and Ostwald ripening of the CdS templates, resulting in the formation of CdS:Mn/ZnS CSNWs 20.

To verify the critical role of water at the intermediate stage of reaction that favors the uniform growth of thin (<10 nm) nanowires with high aspect ratios, several supporting experiments were performed.

EXAMPLE 1

Cadmium acetate and thiourea (1:3 ratio) were added to ethylenediamine (en) and the reaction temperature was maintained at approximately 160° C. The following reaction conditions were set: (i) approximately 6 hrs reaction time, (ii) addition of water (30% V/V) at the intermediate stage (i.e. after 6 hrs), continuation of the reaction for approximately 4 additional hrs, (iii) addition of water at the beginning of approximately 10-hour reaction, and (iv) hydrothermal treatment of the intermediate product obtained from condition (i). The details of the experimental data are described below.

Experimental Details.

The core/shell nanowire growth was carried out in a Teflon lined closed cylindrical stainless steel chamber. In a typical procedure, cadmium acetate and thiourea (1:3 molar ratios) were filled with appropriate amount of ethylenediamine (en) and 3 molar % of manganese acetate was used as the dopant source. The closed chamber was placed inside a preheated oven at approximately 160° C. and the reaction was continued for approximately 6 hours. In the next step, a mixed aqueous solution of zinc-acetate dihydrate (2.6 molar times that of Cd source) and thiourea (1:3 molar ratios) was added and the reaction was continued for approximately 4 additional hrs. Upon normal cooling, the product, a yellow precipitate, was washed several times in water and ethanol and finally dried in vacuum for characterization.

CdS:Mn/ZnS Core/shell Nanowire Product Characterization.

Samples were characterized by high resolution transmission electron microscopy (HRTEM), X-ray diffraction (XRD), X-ray photoelectron spectroscopy (XPS), energy dispersive analysis of X-ray (EDAX) and photoluminescence (PL) measurements.

The morphology of CSNWs as well as other products (obtained from supporting experiments) was determined by the TEM study.

Figure 2A:
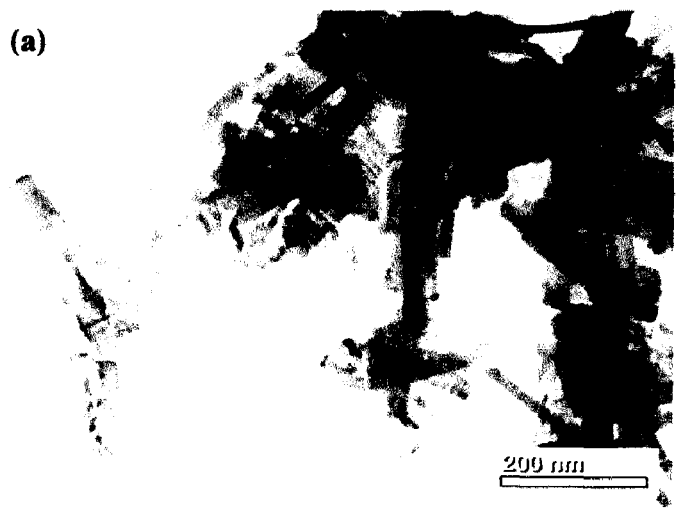
FIG. 2a is a transmission electron microscopy (TEM) image of the CdS:Mn nanowire/sheets.

FIG. 2a shows a TEM image of the product obtained after approximately 6 hours. The product consisted of mostly sheet-like nanostructures along with a few nanowires, revealing the formation of the CdS templates.

Figure 2B:
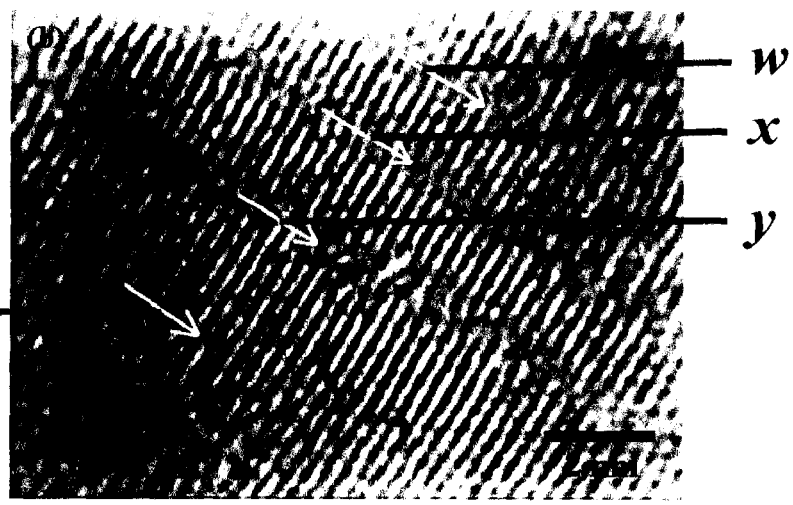
FIG. 2b is a high resolution transmission electron microscopy (HRTEM) image of a single sheet-like structure of the CdS:Mn sheet, showing the formation of needle like crystallite template; the amorphous region between the needle-like crystals is identified.
Figure 2C:
FIG. 2c is a TEM image of the well defined CdS:Mn nanowires.

The HRTEM image shown in FIG. 2b is of a sheet-like nanostructure confirming the formation of needle shaped CdS templates from the layered CdS.0.5en complex. FIG. 2b shows the amorphous lines inside the single crystalline structure (as indicated by arrows w, x, y and z, validating the fabrication scheme in FIG. 1. Uniform, thin (diameter 5-8 nm) CdS nanowires following reaction condition (ii) are shown in FIG. 2c. The length of the nanowires varied in the range between 100-1000 nm. Addition of water to the intermediate product perturbed the equilibrium between the CdS.0.5en complex and CdS phase, favoring the formation of uniform CdS nanowires at 160° C. The HRTEM image of CdS nanowires showed a perfect single crystalline wurtzite structure in FIG. 2d. The measured lattice spacing was 3.35 Å for the lattice planes perpendicular to the axis of the nanowire, representing the (002) lattice plane of wurtzite CdS. The growth direction of the CdS nanowires was in the (002) lattice plane.

Addition of water at the intermediate stage of reaction (i.e. after approximately 6 hrs of reaction) was crucial for the formation of thin (<10 nm) nanowires with a high aspect ratio. To confirm this we performed the supporting experiment (iii) and (iv) as previously mentioned. When water was added with en at the beginning of the reaction i.e. condition (iii), a mixture of short nanorods along with a few nanoparticles were obtained as shown in FIG. 2e. This was attributed to the fact that introduction of water reduced the coordination ability of the en molecules, resulting in incomplete formation of layered CdS template structure. Therefore, short nanorods and nanoparticles were formed. In the supporting experiment (iv), we treated the intermediate products as obtained with approximately 6 hours of reaction time in condition (i) hydrothermally for an additional 4 hrs. FIG. 2f shows the resulting formation of nanorods. The absence of the en molecules induced rapid destruction of the layered structure, preventing recrystallization of the needle shaped CdS templates. The crystal growth was dominated primarily by the Ostwald ripening process.

Figure 2D:
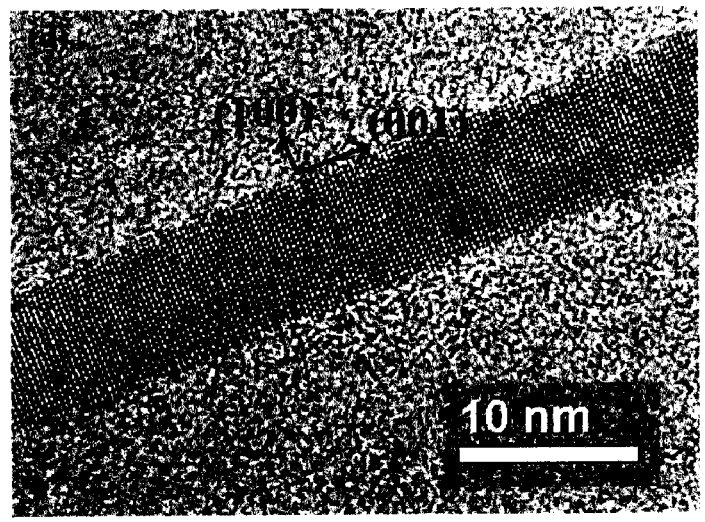
FIG. 2d is a HRTEM image of a single CdS:Mn nanowire showing a perfect single-crystalline structure.
Figure 2E:
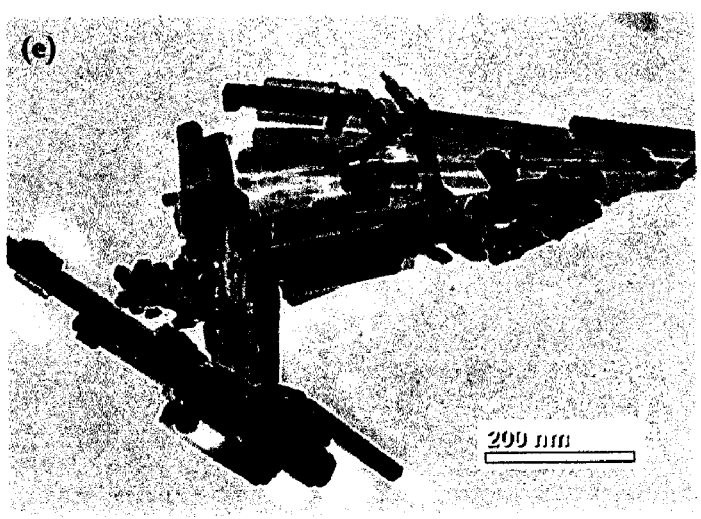
FIG. 2e is a TEM image of CdS:Mn nanowires/particles.
Figure 2F:
FIG. 2f is a TEM image of the short CdS:Mn nanorods obtained by the hydrothermal treatment of the CdS.en complex sheets.

During the studies to control the appropriate solvothermal reaction condition to produce long, thin and uniform-size CdS nanowires as shown in FIGS. 2c and 2d, it was determined that the addition of water at the intermediate reaction stage was the key to the formation of nanowires. Based on these findings, the synthesis protocol for thin (<10 nm) CdS: Mn/ZnS CSNWs with high aspect ratio was developed. The idea was to simply add $Zn^{2+}$ and $S^{2-}$ to aqueous sources to produce the needle-shaped CdS templates and allow the solvothermal process to continue for an additional 4 hours. As expected, the ZnS layer grew radially over the high energy surface of the CdS:Mn templates.

Figure 3A:
FIG. 3a is a TEM image of the CdS:Mn/ZnS core/shell nanowire.
Figure 3B:
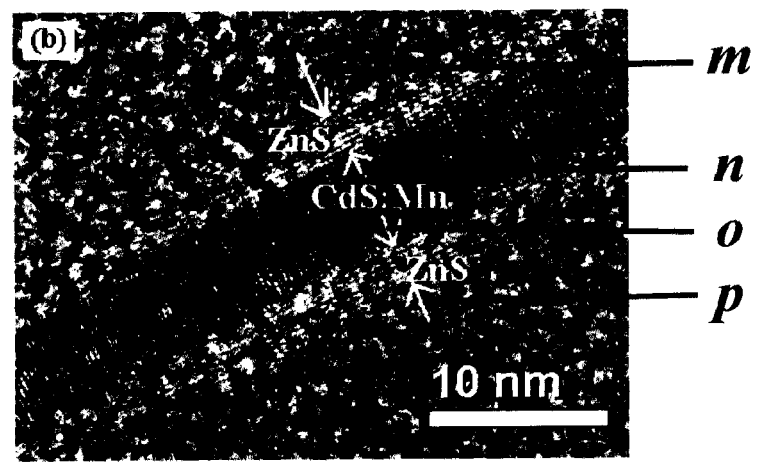
FIG. 3b is a HRTEM image of the CdS:Mn/ZnS core/shell nanowire.
Figure 3C:
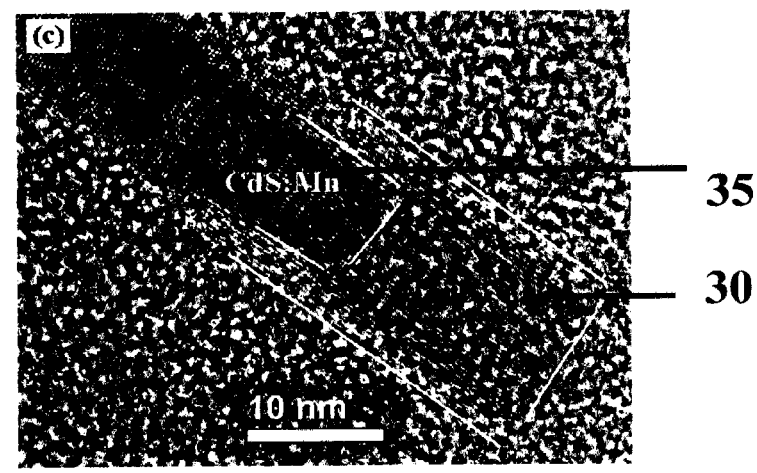
FIG. 3c is a HRTEM image of the CdS:Mn/ZnS core/shell nanowire showing the radial as well as longitudinal growth of the shell layer over the inner core.

As shown in the TEM image in FIG. 3a, these CdS:Mn/ ZnS CSNWs were slightly larger in diameter (5-10 nm) than CdS:Mn nanowires. FIG. 3b shows a HRTEM image of a single CdS:Mn/ZnS nanowire, exhibiting a well defined core/ shell structure. The TEM micrograph showed two distinct regions, a crystalline core and a relatively low-contrast crystalline ZnS shell that uniformly surrounded the central CdS: Mn core. The lattice spacing of the shell part is ~3.31 Å, representing the (100) lattice plane of ZnS. As shown in the FIG. 3b, a clear boundary was observed (marked with arrows m, n, o, p) between the core (n-o) and the shell(m-n and o-p). FIG. 3c showed a HRTEM image of another core/shell CdS: Mn/ZnS nanowire, showing radial growth of ZnS shell 30 over the CdS:Mn nanowire core 35 as well as longitudinal growth of ZnS along the growth direction of the nanowire. The lattice spacing of the (100) plane of ZnS (3.31 Å) is slightly less than that of CdS (3.58 Å). It is expected that the interface of the two crystalline phases which contain some misfit dislocations that would compensate the lattice mismatch between the ZnS (100) plane 30 and CdS (100) plane 35. From TEM investigation of several nanowires, we estimated nanowire diameter to be 5-10 nm, length 100-1000 nm and ZnS shell thickness 2-3 nm. To further support core/shell structure of the nanowires, we performed XRD, XPS, EDAX and PL as described below.

Figure 4:
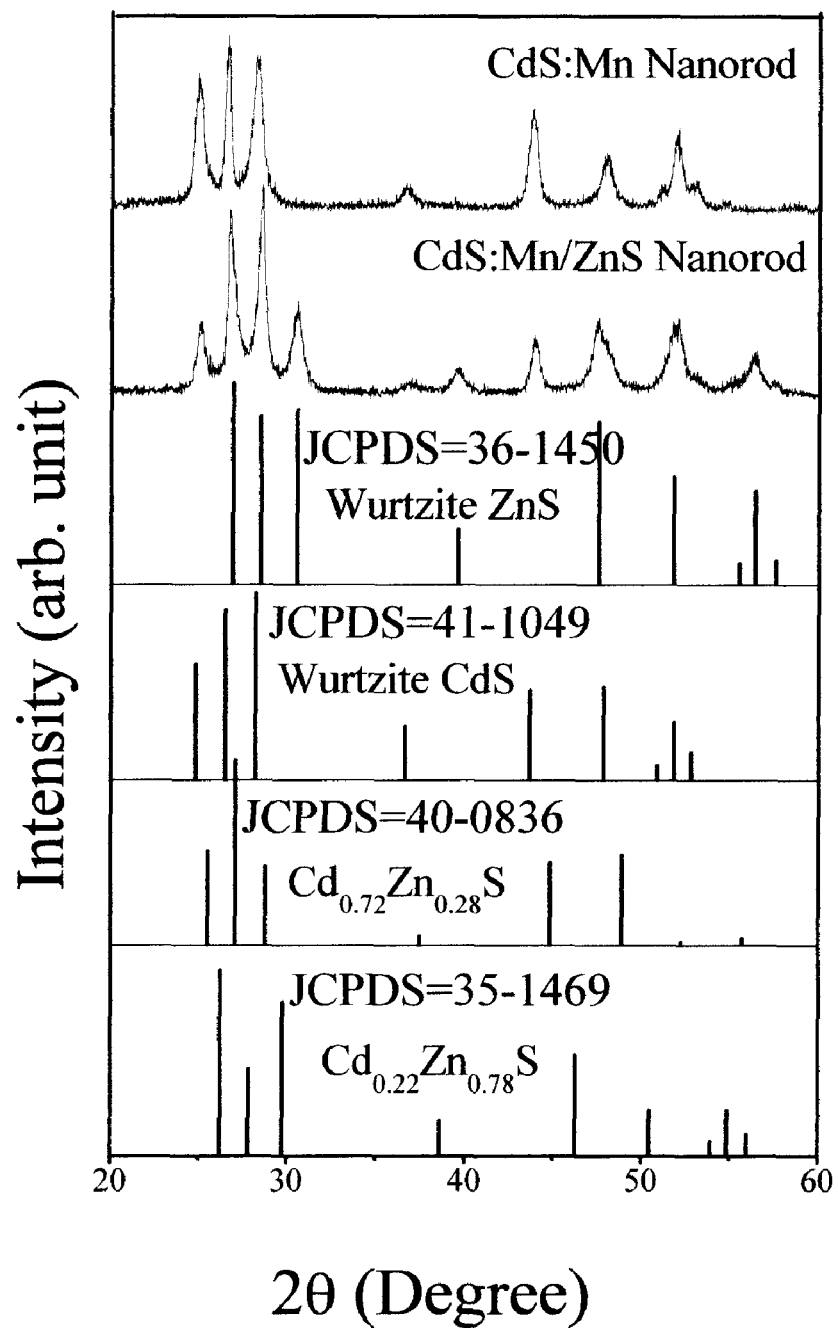
FIG. 4 shows experimental X-ray diffraction (XRD) patterns for CdS:Mn and CdS:Mn/ZnS CSNWs along with the XRD pattern of the standard wurtzite ZnS, CdS and the alloy structures $Zn_xCd_{1-x}S$ obtained from the Joint Committee for Powder Diffraction Standards (JCPDS).

The experimental XRD pattern shown in FIG. 4 of the CSNWs clearly indicates the presence of wurtzite ZnS along with wurtzite CdS. Also, the XRD pattern confirmed the formation of wurtzite phase of CdS nanowires. The growth direction could be predicted by comparing the full width at half maxima (FWHM) of the different XRD peaks of the CdS nanorods. The FWHM value of the XRD peak at a 2θ position 26.5 degree was much smaller when compared to the other peaks in the diffraction pattern. Since the diameters of the well faceted CdS nanowires were less than 10 nm, all the XRD peaks showed characteristic broadening except the peak corresponding to the growth direction for the nanowires. Since the CdS nanowires were very long compared to their diameter, as expected, a narrow XRD peak at 26.5 degree was found. This peak corresponded to the growth direction of the nanowires i.e. [002] that was consistent with the HRTEM image in FIG. 2d. For reference, the standard XRD peaks for wurtzite CdS and ZnS are shown in FIG. 4. Within the sensitivity of the XRD we could not detect the formation of any alloy or oxide phases.

The core/shell structure and elementary compositions of the CSNWs were studied using X-ray photoelectron spectroscopy (XPS) and energy dispersive analysis of X-ray (EDAX). The XPS analysis of CdS:Mn nanowires estimated atomic composition of approximately 50% Cd, 6% Mn and 44% S. The EDAX studies revealed the presence of only ~1% of Mn. Since XPS is a surface-sensitive technique, it indicated that a majority of the Mn ions were located at the surface of the CdS:Mn nanowires. It is expected that with increasing Mn concentrations, more and more Mn ions will be populated at the surface of the nanostructure. From the XPS study, we estimated the atomic composition of the CdS:Mn/ZnS CSNWs to be approximately 10% Cd, 2% Mn, 52% S and 35% Zn, whereas the EDAX estimated the corresponding composition to be 28% Cd, 1% Mn, 52% S and 18% Zn. Within the limitation of the XPS and EDAX sensitivity, these results indicated a Zn-rich surface of the CdS:Mn/ZnS nanowires, further supporting the formation of a ZnS shell layer over the CdS:Mn core.

Figure 5:
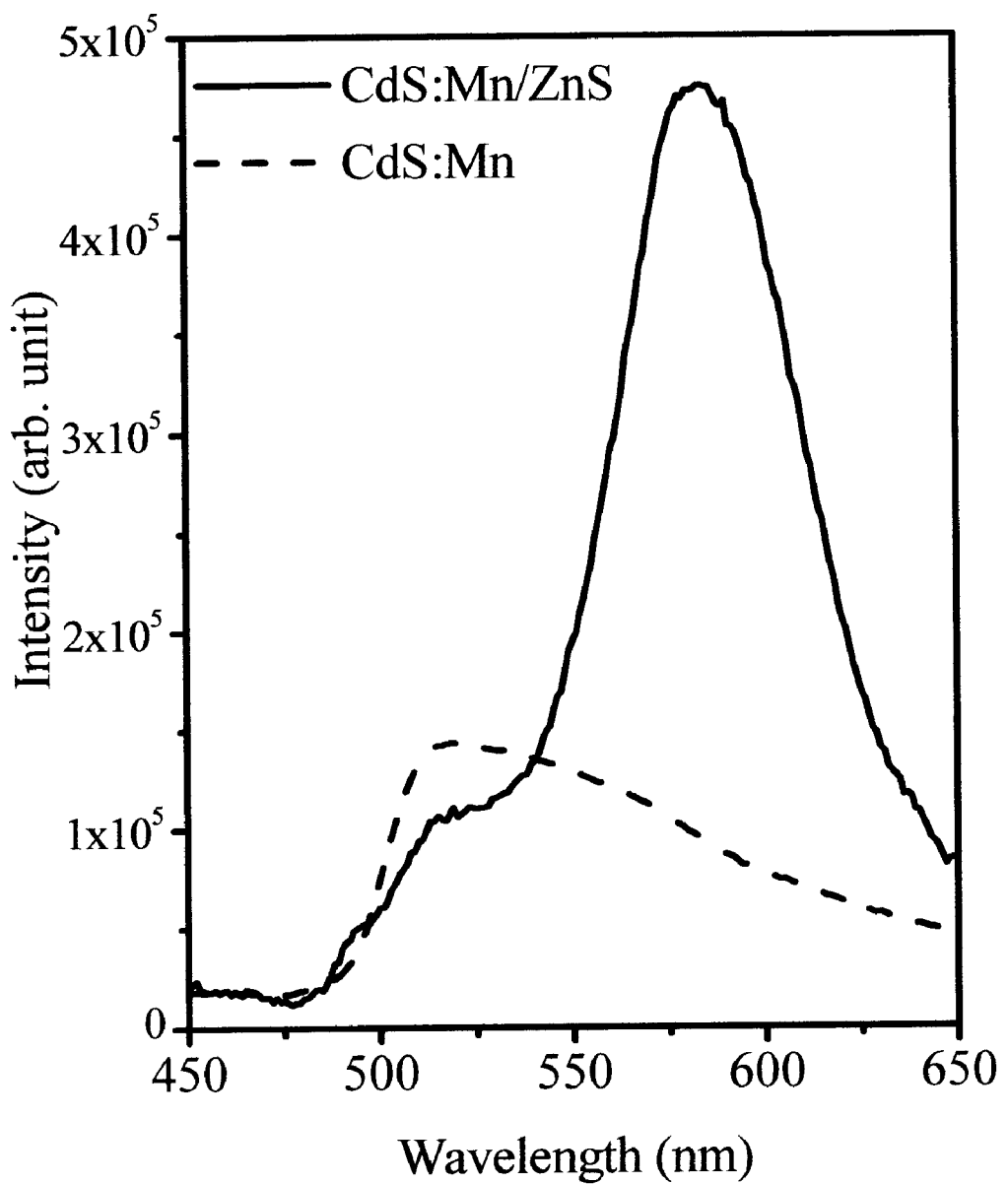
FIG. 5 is the room temperature photoluminescence (PL) spectra of the CdS:Mn (broken line) and CdS:Mn/ZnS (solid line) core/shell nanowires.

The formation of the core/shell nanostructure was also supported by room-temperature photoluminescence (PL) studies of CdS:Mn/ZnS CSNWs. The PL properties of CdS:Mn/ZnS CSNWs as well as CdS:Mn nanowires are presented in FIG. 5. The PL spectrum of the CdS:Mn nanowires showed a green emission band at ~514 nm, corresponding to band-edge emission [20]. The broad asymmetric tail of the luminescence peak could be attributed to a large number of surface states in the CdS:Mn nanowires. No characteristic emission from $Mn^{2+}$ ions were observed at ~585 nm. Earlier studies did not show any Mn-related emission from the CdS:Mn nanowires at room temperature, indicating the presence of a large number of surface states that were responsible for photodegradation and luminescence quenching. The PL spectrum of the core/shell CdS:Mn/ZnS nanowires exhibited a strong yellow emission band at ~585 nm along with a weak green emission peak at ~514 nm. The decrease in the intensity of the band-edge emission band is consistent with energy transfer to the Mn ions in the crystal lattice. The yellow emission is attributed to the $Mn^{2+}$ $4T_1$ to $^6A_1$ d-d ligand-field transition, confirming successful passivation of surface states of the CdS:Mn core by the ZnS shell layer. Thus, the photoluminescence (PL) study also supports the formation of a core/shell structure of CdS:Mn/ZnS nanowires.

In conclusion, for the first time, we have successfully synthesized thin (<10 nm) core/shell CdS:Mn/ZnS nanowires with a high aspect ratio (length/diameter >150) by a simple two-step solvothermal technique. By tuning temperature and other appropriate reaction parameters the diameter of the nanowires as well as the Mn concentration are easily varied. The present technique is capable of being scaled-up for the synthesis of core/shell nanowires (CSNWs) of various kinds (i.e. with and without dopants).

While the invention has been described, disclosed, illustrated and shown in various terms of certain embodiments or modifications which it has presumed in practice, the scope of the invention is not intended to be, nor should it be deemed to be, limited thereby and such other modifications or embodiments as may be suggested by the teachings herein are particularly reserved especially as they fall within the breadth and scope of the claims here appended.

We claim:

1. A method for synthesizing a dopant based core/shell single-crystalline, one dimensional CdS:Mn/ZnS nanowire comprising the steps of:
    selecting a reaction chamber;
    mixing cadmium acetate and thiourea in a 1:3 molar ratio with ethylenediamine solvent to form mixture I;
    adding the mixture of cadmium acetate, thiourea and ethylenediamine (mixture I) to the reaction chamber;
    adding a dopant source to the reaction chamber;
    closing the reaction chamber for a first time and placing the chamber in a preheated oven;
    allowing the reaction of cadmium acetate, thiourea, ethylenediamine (mixture I) and dopant to continue for approximately six hours to facilitate the solvothermal growth of cadmium sulfide nanorods and nanowires;
    removing the reaction chamber from the preheated oven after six hours and adding a mixed aqueous solution (mixture II) consisting of zinc acetate dehydrate, thiourea and water;
    closing the reaction chamber a second time and placing the chamber in a preheated oven;
    allowing the reaction of mixture I, dopant and mixture II to continue for approximately an additional 4 hours to facilitate the growth of a doped cadmium sulfide core with a zinc sulfide outer shell;
    removing the reaction chamber from the preheated oven for a second time and allowing the reactor to cool; and
    collecting a yellow precipitate that is washed, dried and analyzed to be a one-dimensional, doped cadmium sulfide/zinc sulfide (CdS:Mn/ZnS) core/shell nanowire wherein an overall diameter of the nanowire is less than or equal to 10 nanometers (nm) and an overall length to diameter ratio is up to approximately 150.

2. The method of claim 1, wherein the reaction chamber is a closable cylindrical stainless steel chamber lined with a polymeric non-stick coating.

3. The method of claim 1, wherein the dopant source is manganese acetate.

4. The method of claim 1, wherein the mixed aqueous solution (mixture II) consists of zinc acetate dihydrate in an amount that is 2.6 molar times that of the Cd molar concentration in mixture I and thiourea in an amount that is 3 molar times that of the Zn molar concentration in mixture II.

5. The method of claim 1, wherein the preheated oven is maintained at a temperature that is between approximately 155° C. and approximately 165° C.

6. The method of claim 5, wherein the preheated oven is maintained at a temperature that is approximately 160° C.

7. The method of claim 1, wherein the one dimensional nanowire has a zinc sulfide shell formed radially surrounding the doped cadmium sulfide core.

8. The method of claim 1, wherein the one dimensional nanowire has a room temperature photoluminescence spectra of the core/shell nanowire that exhibits a strong yellow emission band at approximately 585 nanometer (nm) wavelength along with a weak green emission peak at approximately 514 nm wavelength.

9. A thin dopant based core/shell single-crystalline, one dimensional nanowire comprising
    a doped cadmium sulfide core in a nanowire;
    a zinc sulfide outer shell layered onto the doped cadmium sulfide core;
    an overall diameter of the nanowire that is less than or equal to 10 nanometers (nm); and
    an overall length to diameter ratio is up to approximately 150.

10. The one dimensional nanowire of claim 9 wherein the diameter of the nanowire is in a range between approximately 5-8 nm and the length of the nanowire is in a range between approximately 100 to 1000 nm.

11. The one dimensional nanowire of claim 9, wherein the doped cadmium sulfide core contains a dopant that is manganese (Mn).

12. The one dimensional nanowire of claim 11, wherein the composition is manganese doped cadmium sulfide core with zinc sulfide shell (CdS:Mn/ZnS).

13. The one dimensional nanowire of claim 12 wherein the zinc sulfide shell is formed radially surrounding the doped cadmium sulfide core.

14. The one dimensional nanowire of claim 9, wherein the room temperature photoluminescence spectra of the core/shell nanowire exhibits a strong yellow emission band at approximately 585 nanometer (nm) wavelength along with a weak green emission peak at approximately 514 nm wavelength.

* * * * *